United States Patent
Seaton et al.

(10) Patent No.: US 6,853,553 B2
(45) Date of Patent: Feb. 8, 2005

(54) HEAT DISSIPATION SYSTEM FOR AUDIO AMPLIFIER

(75) Inventors: David W. Seaton, Hermosa Beach, CA (US); Mark H. Powell, Marina del Rey, CA (US); Jason R. Taylor, Irvine, CA (US); Eric Mendenhall, Dove Canyon, CA (US)

(73) Assignee: Gibson Guitar Corp., Nashville, TN (US)

( * ) Notice: Subject to any disclaimer, the term of this patent is extended or adjusted under 35 U.S.C. 154(b) by 58 days.

(21) Appl. No.: 10/405,983

(22) Filed: Apr. 1, 2003

(65) Prior Publication Data

US 2004/0036563 A1 Feb. 26, 2004

Related U.S. Application Data

(60) Provisional application No. 60/369,733, filed on Apr. 4, 2002.

(51) Int. Cl.[7] .................................................. H05K 7/20
(52) U.S. Cl. ........................ 361/695; 361/690; 361/687; 165/185; 174/16.1
(58) Field of Search ................................. 361/687, 690, 361/692, 695, 704, 710–712, 715, 717–724, 735, 737; 165/80.2, 80.3, 80.4, 185; 174/16.1, 16.3, 252; 381/87, 332, 335; 330/65; 454/184

(56) References Cited

U.S. PATENT DOCUMENTS

| | | | | |
|---|---|---|---|---|
| 3,778,551 A | * | 12/1973 | Grodinsky | 381/335 |
| 3,909,679 A | * | 9/1975 | Petri | 361/710 |
| 4,103,737 A | * | 8/1978 | Perkins | 165/109.1 |
| 4,811,403 A | * | 3/1989 | Henricksen et al. | 381/87 |
| 4,901,029 A | * | 2/1990 | Fujino et al. | 330/65 |
| 5,000,079 A | | 3/1991 | Mardis | 98/1 |
| 5,132,780 A | | 7/1992 | Higgins, III | 357/81 |
| 5,481,433 A | | 1/1996 | Carter | 361/690 |
| 5,482,109 A | | 1/1996 | Kunkel | 165/80.3 |
| 5,485,350 A | | 1/1996 | Hecht et al. | 361/692 |
| 5,514,036 A | | 5/1996 | Lin | 454/184 |
| 5,533,132 A | * | 7/1996 | Button | 381/332 |
| 5,689,403 A | * | 11/1997 | Robertson et al. | 361/695 |
| 5,704,212 A | | 1/1998 | Erler et al. | 62/3.2 |
| 5,822,188 A | | 10/1998 | Bullington | 361/695 |
| 5,828,549 A | | 10/1998 | Gandre et al. | 361/695 |
| 5,871,396 A | | 2/1999 | Shen | 454/184 |
| 5,946,188 A | | 8/1999 | Rochel et al. | 361/690 |
| 6,021,042 A | | 2/2000 | Anderson et al. | 361/695 |
| 6,034,871 A | | 3/2000 | Cheng | 361/695 |
| 6,069,792 A | | 5/2000 | Nelik | 361/687 |
| 6,075,697 A | | 6/2000 | Kerrigan et al. | 361/695 |
| 6,094,345 A | | 7/2000 | Diemunsch | 361/695 |
| 6,118,658 A | | 9/2000 | Nakase | 361/697 |
| 6,134,107 A | | 10/2000 | Kerrigan et al. | 361/694 |
| 6,244,953 B1 | | 6/2001 | Dugan et al. | 454/184 |
| 6,317,319 B1 | | 11/2001 | Lewis et al. | 361/695 |

OTHER PUBLICATIONS

Peavey Technotes, Heat Sink Technology, Heat Tunnels, Thermal Gradients, and More, copyright 2002.

Schell et al., Leben mit fremden Genen, *Naturwissenschaftliche Rundschau* 36:254–260 (1983).

Shaw, Genetic engineering of crop plants: a strategy for the future, and the present, *Chemistry and Industry*, pp 817–824 (1984).

Winaker, *From Genes to Clones*, pp. 404–411 (1987).

* cited by examiner

*Primary Examiner*—Michael Datskovsky
(74) *Attorney, Agent, or Firm*—Waddey & Patterson, P.C.; Lucian Wayne Beavers

(57) ABSTRACT

A heat dissipation system for an audio amplifier is presented, including a housing having a plurality of apertures therein; at least one completely enclosed air tunnels, each air tunnel extending between one of the apertures in the housing and another of the apertures in the housing, each air tunnel at least partially defined by a pair of opposed heat sinks mounted within the housing.

20 Claims, 6 Drawing Sheets

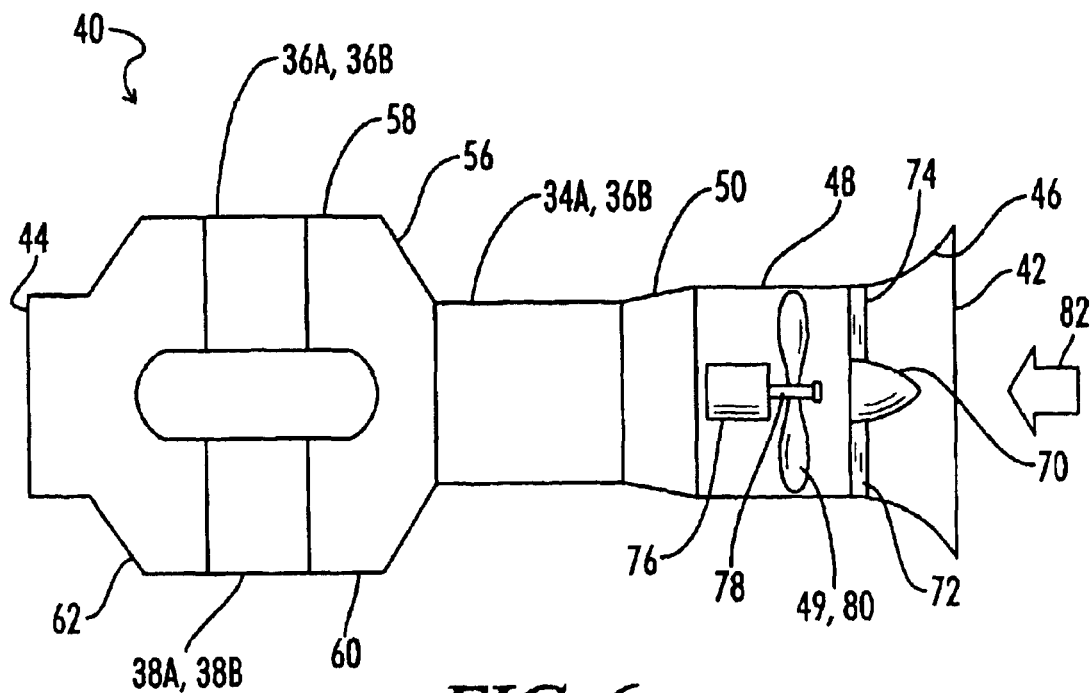
FIG. 6
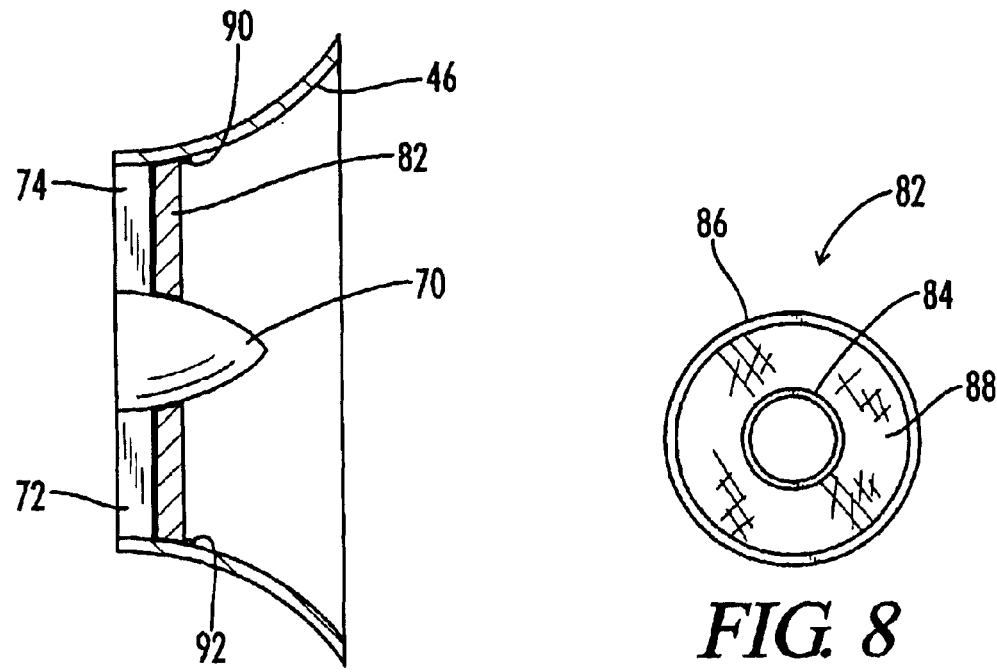
FIG. 7
FIG. 8

HEAT DISSIPATION SYSTEM FOR AUDIO AMPLIFIER

RELATED APPLICATION

This application claims benefits under 35 U.S.C. §119(e) of U.S. Provisional Patent Application Ser. No. 60/369,733 filed Apr. 4, 2002, entitled "Amplifier Having Cooling Tunnel With Venturi," the details and disclosure of which is incorporated herein by reference.

BACKGROUND OF THE INVENTION

1. Field of the Invention

The present invention relates generally to the cooling of electronic apparatus. More specifically, the present invention presents a cooling system for a rack mounted audio amplifier.

2. Description of the Prior Art

Oftentimes, a limiting factor in the design of electronic equipment such as audio amplifiers, is heat dissipation. With the advent of new and more sophisticated electronic components, the heat generated in the apparatus, if not properly dissipated, can often be so great as to degrade apparatus performance.

The need for greater heat dissipation is balanced by the sensitivity of sophisticated electronic components to contamination by dust or other particulate matter, which can often be borne in the air passed through the apparatus for cooling purposes. Moreover, in an application such as an audio amplifier, noise generation by the cooling system must, of necessity, be kept to a minimum or eliminated entirely.

Traditionally, audio amplifiers have been cooled by the use of a fan drawing air into the amplifier housing through openings in the housing. The air then flows freely throughout the interior of the housing and exits through an outlet in the housing. More recently, partially enclosed cooling system designs, have been suggested. For instance, in U.S. Pat. No. 5,726,603 to Chawa et al., a forced air cooling tunnel having a plurality of fans drawing air through the tunnel is illustrated. In a similar vein is a device sold by Peavey Electronics as its "Turbo/V Cooling" which utilizes a partially closed tunnel, partially defined by a pair of diverging heat sinks. And, in U.S. Pat. No. 6,259,798 to Perkins et al., a passive radiator-cooled electronic heat sink housing for a powered speaker is described.

In U.S. Pat. No. 5,946,188, Rochel et al. disclose a pair of heat sinks, each formed as first and second tunnels connected by a Peltier device toward one end of the tunnels. One of the heat sinks abuts electronic components and passes heat to be dissipated into the interior tunnel where air flow carries the heated air to the second tunnel from which it is exhausted.

Nothing in the art, however, provides an audio amplifier cooling system which is capable of maximizing heat dissipation by heat sinks while still isolating the interior of an amplifier from air borne particulates and noise. Accordingly, there is a continuing need in the art for an improved cooling system for an audio amplifier.

SUMMARY OF THE INVENTION

The present invention provides an audio amplifier having an improved cooling system. The inventive cooling system comprises a plurality of completely enclosed cooling tunnels, each cooling tunnel defined between a tunnel inlet formed in the housing of the audio amplifier and at least one tunnel outlet formed in the housing of the audio amplifier at a different location. The tunnels are at least partially defined by a pair of opposed heat sinks, each of the heat sinks in operative connection with an electronic component. The heat sinks each preferably comprise a plurality of fins extending into the respective tunnels, in order to increase the available heat sink surface area exposed to air flow. Preferably, the cooling tunnel inlets are located at the rear of the housing whereas the cooling tunnel outlets are located at the front of the housing.

In another embodiment of the present invention, the cooling tunnels each comprise a plurality of branches extending through the housing, each of the branches also at least partially defined by pairs of opposed heat sinks.

In an additional embodiment, the inlet to the cooling tunnels is defined by a venturi section capable of increasing the air speed of incoming cooling air.

Accordingly, it is an object of the present invention to provide an improved cooling system for an audio amplifier.

Another object of the invention is to provide a cooling system for an audio amplifier which isolates cooling air as it passes through the housing of the amplifier.

Still another object of the present invention is to isolate noise from the cooling system from the electronic components of the audio amplifier.

Yet another object of the invention is a venturi inlet for a cooling system for an audio amplifier capable of increasing the velocity of air flow through the cooling system.

These objects and others which will be apparent to the skilled artisan can be achieved by the provisions of a heat dissipation system for an audio amplifier, which includes a housing having a plurality of apertures, which act as inlets and outlets therein; and at least one, and most preferably a plurality of, completely enclosed air tunnels, each air tunnel extending between one of the apertures (i.e., inlets) in the housing and another of the apertures (i.e., outlets) in the housing, each air tunnel at least partially defined by a first pair of opposed heat sinks mounted within the housing. Advantageously, the tunnels are isolated from the electronic components of the amplifier. Moreover, the heat sinks each preferably have at least one fin extending into the interior of the tunnel.

The audio amplifier can comprise at least one printed circuit board having a plurality of electronic components mounted thereon, wherein each of the heat sinks is in operative contact with at least one of the electronic components.

In the inventive system a fan can be positioned adjacent each of the inlets; and a venturi used for increasing airflow to the fan. In addition the air tunnels can each include a plenum for directing air from the inlet to the pair of opposed heat sinks.

In an especially preferred embodiment, each air tunnel includes a splitter downstream of the first pair of heat sinks for splitting the air tunnel into first and second branches, wherein each of the first and second branches is at least partially defined by pairs of opposed heat sinks, wherein each of the heat sinks defining the first and second branches comprises fins extending into the interior of the branches and the interior of the branches is isolated from the electronic components. The air tunnel can also include a collector, which directs airflow to the outlet.

The amplifier housing preferably includes front and rear panels having the outlets and inlets of the tunnels defined therein.

It is to be understood that both the foregoing general description and the following detailed description present embodiments of the invention and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operation of the invention.

BRIEF DESCRIPTION OF THE DRAWINGS

FIG. 6 is a schematic view of a preferred embodiment of the inventive heat dissipation system.

FIG. 7 is a cross sectional schematic view of the inlet venturi of the inventive heat dissipation system with an aerodynamic nose cone and a filter located therein.

FIG. 8 is a schematic illustration of the removable air filter of FIG. 7.

DESCRIPTION OF THE PREFERRED EMBODIMENTS

Figure 1:
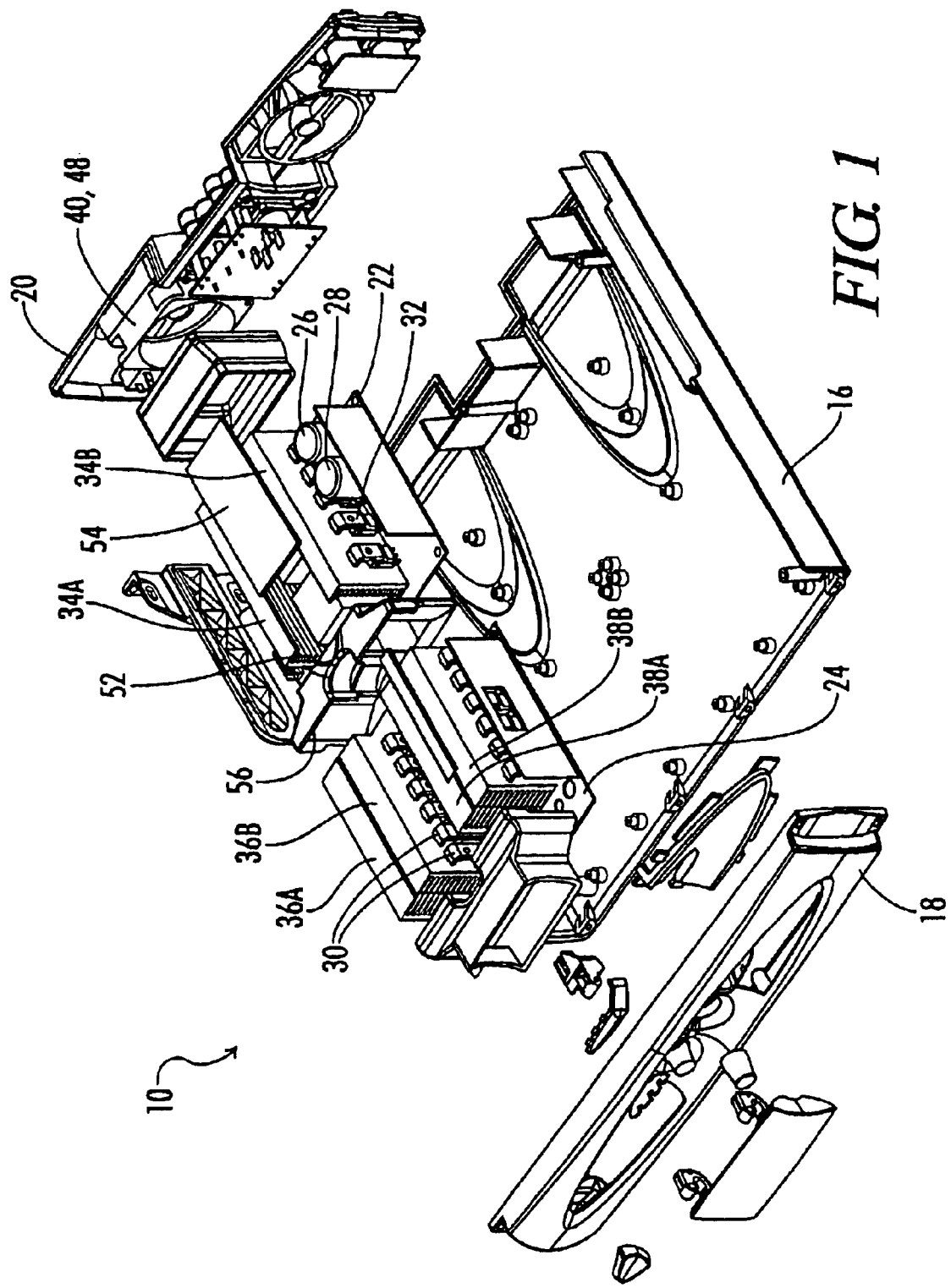
FIG. 1 is an exploded view of an audio amplifier embodying the heat dissipation system of the present invention.

Embodiments of the present invention will now be described in greater detail. Like or similar reference numerals will be used whenever possible, although, for the sake clarity, not all reference numbers are shown in each drawing. The heat dissipation system of the present invention will be described in terms of inclusion in an audio amplifier; such is for convenience only. It will be understood that the inventive cooling system can be applied to any electronic apparatus having the same requirements. Likewise, the invention will be described with respect to a specific orientation and relationship of elements with respect to each other, but it will be recognized by the skilled artisan that other orientations and relationships will be equally applicable.

Referring now to the drawings, and particularly to FIGS. 1–5, the amplifier apparatus of the present invention is shown and generally designated by the numeral 10. The amplifier 10 includes a housing 12, which is advantageously made up of a top-housing shell 14, a bottom-housing shell 16, a front panel 18, and a rear panel 20.

A plurality of printed circuit boards and the like, such as 22 and 24 are mounted within the housing. On each circuit board there are a plurality of electronic components such as 26, 28, 30 and 32. Electronic components 26, 28, 30 and 32 are in operative contact with heat sinks so that heat generated by the electronic components is carried away from the components by the heat sinks in order to cool the electronic components. Although direct physical connection between the heat sinks and electronic components 26, 28, 30 and 32 is preferred, intermediate apparatus such as thermal interfaces, heat pipes, cooling plates, etc., may be employed. In FIG. 1 there is a first pair of opposed heat sinks 34A and 34B, a second pair of opposed heat sinks 36A and 36B, and a third pair of opposed heat sinks 38A and 38B.

An enclosed cooling tunnel system 40 is defined within the housing 12, cooling tunnel 40 at least partially defined by the space between opposed heat sinks 34A and 34B.

Figure 2:
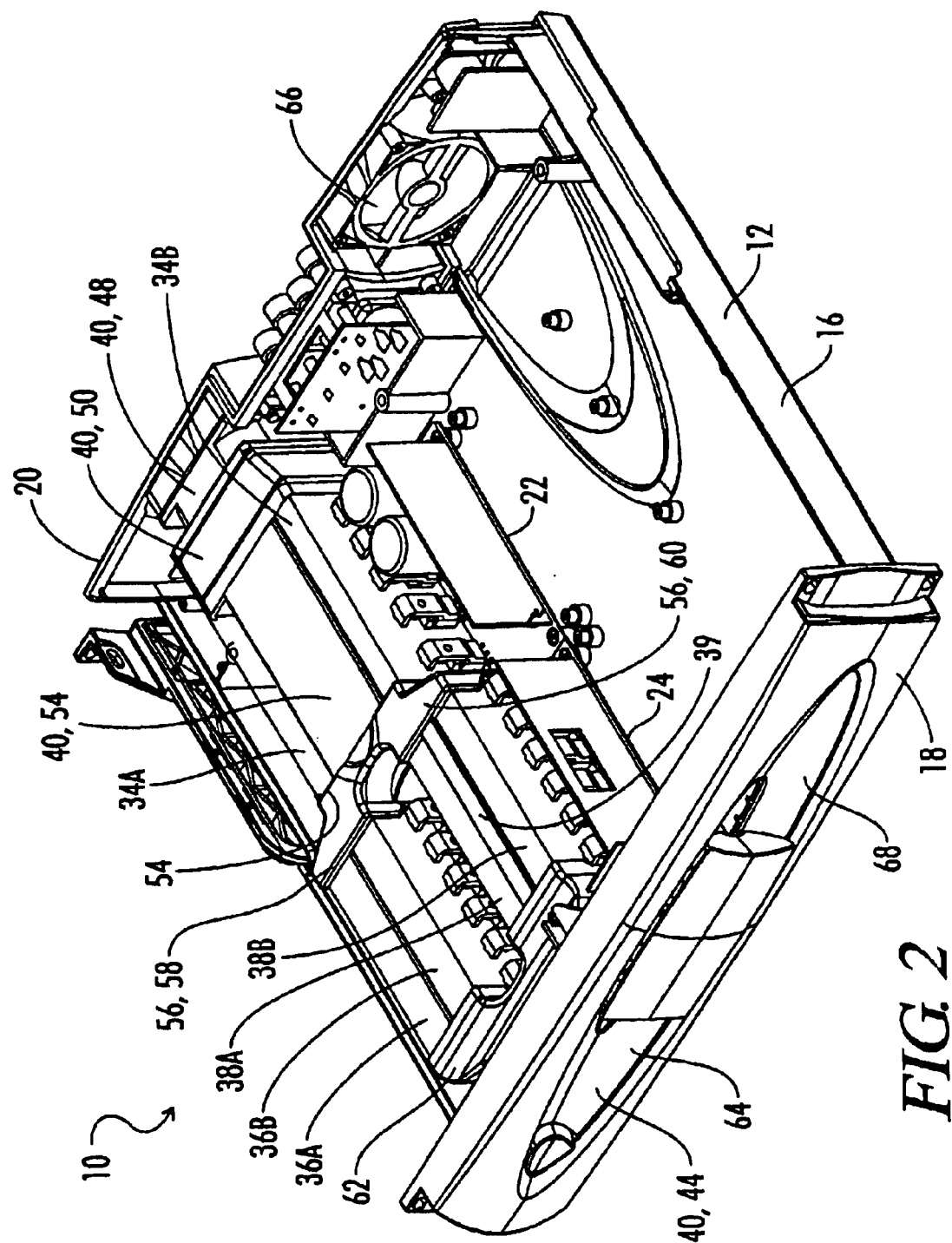
FIG. 2 is a front perspective assembled view of the audio amplifier of FIG. 1 with the top portion of the housing removed and with the components in one half of the housing removed so as to provide better visualization of the remaining components and the cooling tunnel system.
Figure 3:
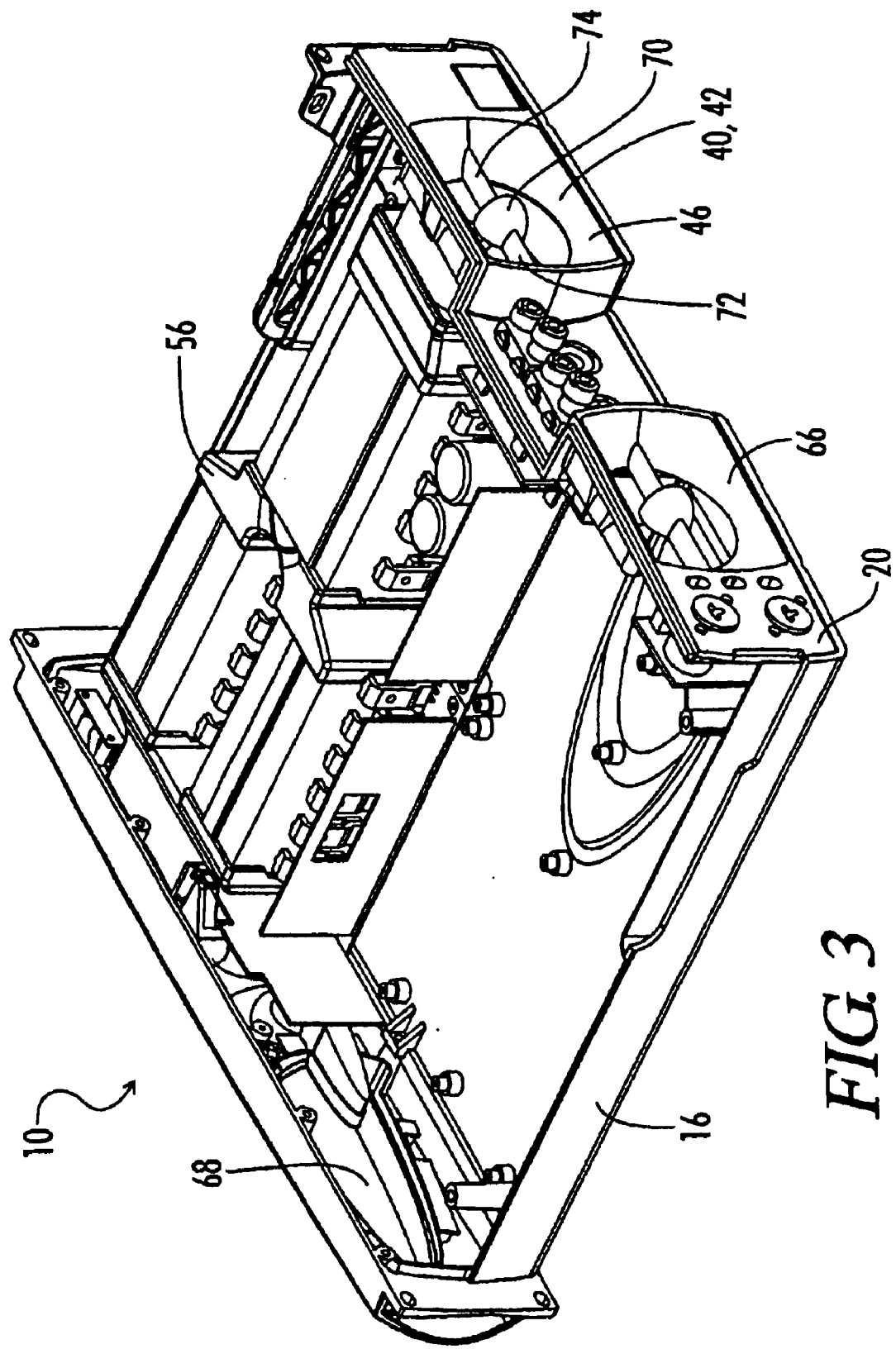
FIG. 3 is a rear perspective assembled view of the audio amplifier of FIG. 1 with the top portion of the housing removed and with the components in one half of the housing removed so as to provide better visualization of the remaining components and the cooling tunnel system.
Figure 4:
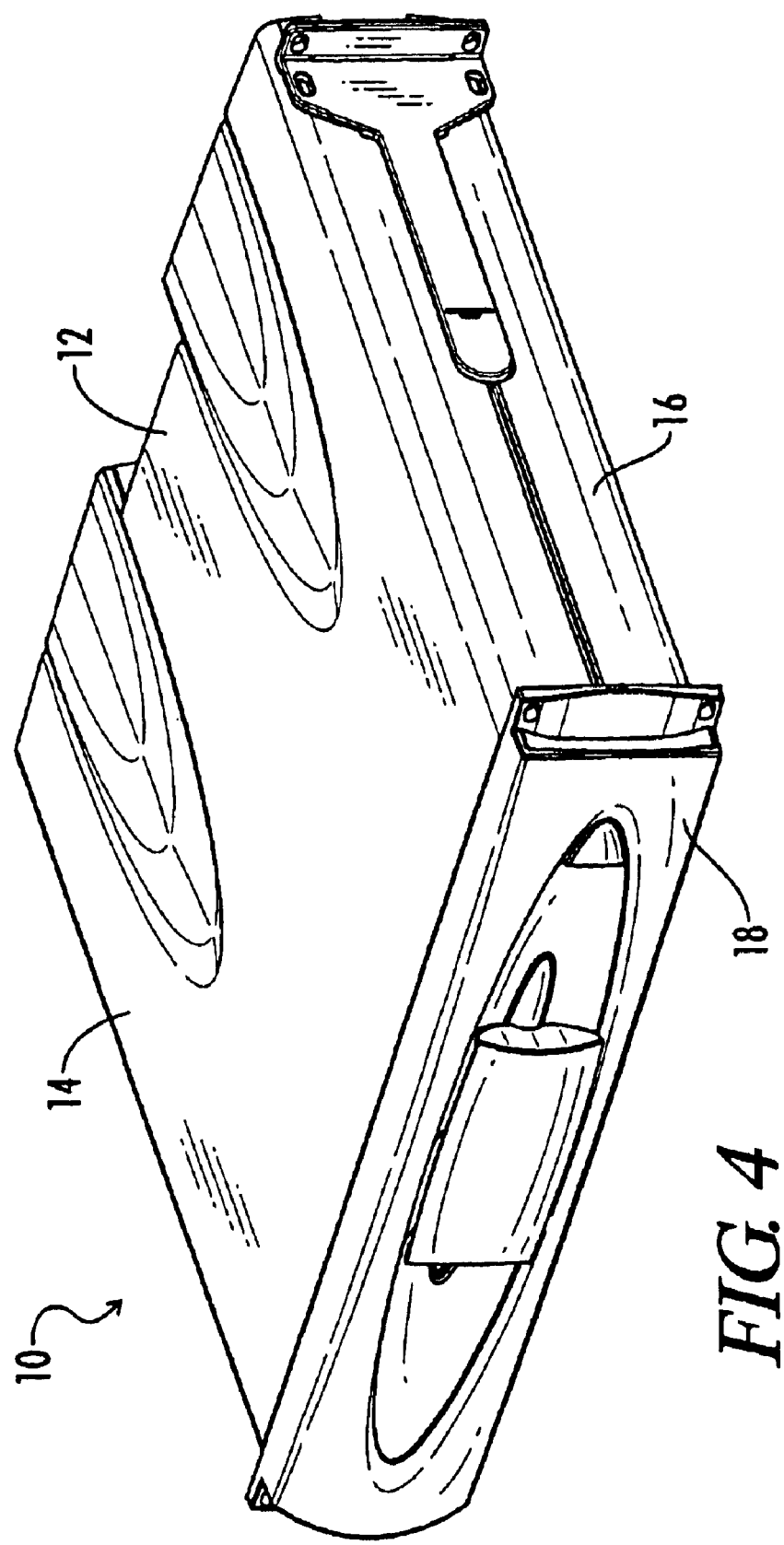
FIG. 4 is a front upper perspective exterior view of the audio amplifier of FIG. 1.
Figure 5:
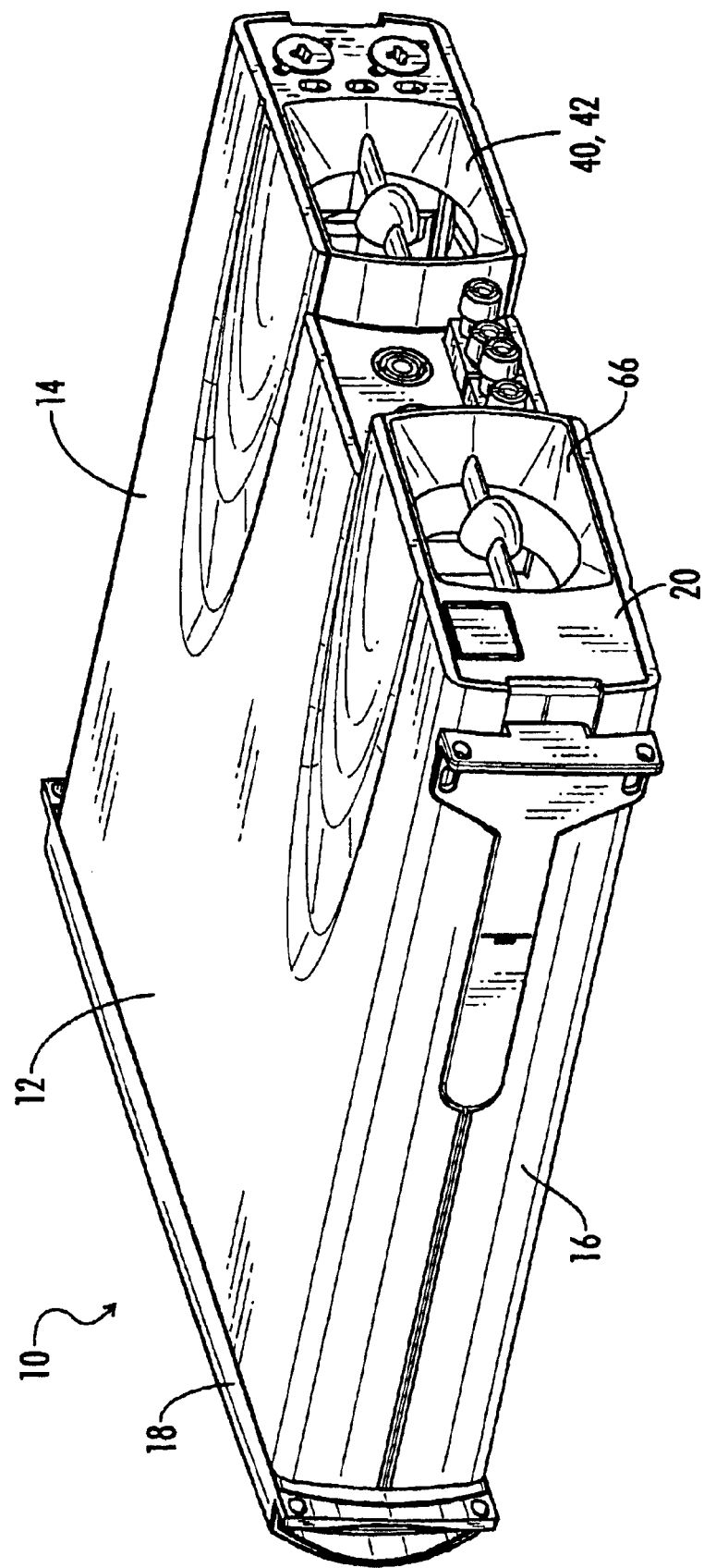
FIG. 5 is a rear upper exterior perspective view of the audio amplifier of FIG. 1.

In the rear view of FIG. 3, the inlet 42 of cooling tunnel 40 is shown. In the front view of FIG. 2, the outlet 44 of cooling tunnel system 40 is shown. The various components, which make up the preferred embodiments of cooling tunnel system 40, will now be described, starting at the inlet 42 and moving to the outlet 44.

Defined in the rear panel 20 of housing 12 is a venturi 46, which defines the inlet 42. As used herein, the term "venturi" refers to a tapered housing surrounding the inlet so that an increased amount of air will be drawn through the inlet as contrasted to a simple opening cut in a flat housing wall. The venturi 46 funnels accelerated air into the cooling channel 40.

The venturi 46 leads to a fan shroud 48 within which is mounted a fan 49 for drawing air through the inlet 42. The fan shroud 48 may be a part of the fan assembly itself. There may also be a mesh screen fitted in between the inside face of the venturi 46 and the fan shroud 48.

As best seen in FIG. 2, the fan shroud 48 is connected to a plenum 50 which leads to a portion of the cooling tunnel system, which is partially defined by the first pair of opposed heat sinks 34A and 34B.

As can be seen in FIG. 1, each of the heat sinks 34A and 34B includes a plurality of fins such as 52. In this embodiment, the pair of heat sinks 34A and 34B are resting upon the printed circuit board 22 with their fins 52 pointing toward each other. Heat sinks 34A and 34B are in operative contact with electronic components 26, 28, 30 and 32 arrayed on printed circuit board 22. Most preferably such contact is direct physical contact, or with a thermal interface (not shown) or the like interposed therebetween.

A sealing strip 54 closes the gap between heat sinks 34A and 34B from above, so as to define a portion of the cooling tunnel between the printed circuit board 22 on bottom, the heat sinks 34A and 34B on the sides and the sealing strip 54 on the top, which portion is in air flow communication with the plenum 50 as best seen in FIG. 2.

A downstream end 54 of the just described portion of the cooling tunnel 40 is communicated with a splitter 56, which may also be described as a diverging air tunnel shroud 56. The splitter 56, which can be described as being downstream of the first pair of heat sinks 34A and 34B, splits the air tunnel into first and second branches 58 and 60.

First branch 58 leads to a portion of the air tunnel which is partially defined by the second pair of heat sinks 36A and 36B, and the second branch 60 leads to a branch of the air tunnel which is partially defined by the third pair of heat sinks 38A and 38B in a manner similar to that previously described for the first pair of heat sinks 34A and 34B. Each pair of heat sinks 34A and B, and 36A and B has the gap therebetween sealed by a sealing strip 39.

An exhaust collector 62, which may also be described as a converging air tunnel shroud 62, receives the air from branches 58 and 60 after it is passed between the pairs of opposed heat sinks 36A and 36B, and 38A and 38B, and carries the air to the outlet 44 which is preferably covered by a grill mesh 64 or the like.

Thus, it is seen that the cooling tunnel system 40 provides a completely enclosed air tunnel leading from the inlet 42 to the outlet 44. The air passing through tunnel 40 passes over the fins such as 52 of the heat sinks 34A and 34B, 36A and 36B and 38A and 38B, but that cooling air is completely isolated from the electronic components such as 26, 28, 30 and 32. Thus, the electronic components themselves are not exposed to dust or other particulate matter carried by the cooling air, and are also isolated from any noise generated by fan 49.

As previously noted, in FIGS. 1–3 only approximately one half of the electronics of the amplifier 10 are shown and this is the half that is located on what can be referred to as the left hand side of housing 12. The right hand side of the housing 12 would also include additional circuit boards and components, and a second essentially identical cooling tunnel leading from a second inlet 66 to a second outlet 68 within the housing 12.

As best seen in FIG. 3, each of the inlets 42 and 66 has an aerodynamic nose cone such as 70 centrally located in the inlet and facing outward of the inlet. The nose cone 70 is integrally molded as a portion of the rear housing panel 20 and is structurally held in place at an axial central location of the inlet 42 by spars 72 and 74 which extend to the wall of venturi 46.

As is best seen in the schematic view of FIG. 6, the fan 49 includes a motor 76 having a fan shaft 78, which carries fan blade 80. The fan shaft 78 is axially located within the fan shroud 48 and is sheltered from air flow 82 entering inlet 42 by the aerodynamic shaped nose cone 70. The fan motor 76 is also sheltered. The aerodynamic shape of nose cone 70 minimizes turbulence of the airflow 82 entering inlet 42. The diameter of nose cone 70 is preferably approximately the same as the diameter of the exterior of the fan motor 76.

It is noted that the completely enclosed nature of the cooling tunnel system 40, which isolates dust from the electronic components such as 26, 28, 30 and 32, actually provides a system wherein it is not necessary to filter the air flowing therethrough, because dust from the air is not in contact with the sensitive electronic components 26, 28, 30 and 32. In a preferred embodiment of the invention, however, as schematically illustrated in FIG. 7, a removable air filter 82 is received across the inlet 42 and is accessible from outside the housing 12 for replacement of the air filter 82.

As seen in FIGS. 7 and 8, the air filter 82 may be formed from two resilient plastic inner and outer rings 84 and 86 with an annular foam type filter element 88 held therebetween. The inner ring 84 fits closely over nose cone 70 and the outer ring 86 fits closely within venturi 46 and may be held in place therein by protruding retaining bumps 90 and 92, or similar retaining detail, defined in the venturi 46.

Thus, the air filter element 82 can be removed by grasping the same from the exterior of the housing 42 and pulling it out of the venturi 46, and similarly, a replacement air filter can be inserted back into place.

The foam air filter element 88 also serves as a sound damping element to reduce the audibility of noise from fan 49 to the user.

All cited patents and publications referred to in this application are incorporated by reference.

The invention thus being described, it will be apparent that it may be varied in many ways. Such variations are not to be regarded as a departure from the spirit and scope of the present invention and all such modifications as would be apparent as one skilled in the art are intended to be included within the scope of the following claims.

What is claimed is:

1. A heat dissipation system for an audio amplifier, comprising:
   (a) a housing having a plurality of inlets and outlets therein;
   (b) a plurality of completely enclosed air tunnels, each air tunnel extending between one of the inlets in the housing and one of the outlets in the housing, each air tunnel at least partially defined by a pair of opposed heat sinks mounted within the housing.

2. The system of claim 1 wherein the audio amplifier comprises at least one printed circuit board having a plurality of electronic components mounted thereon, wherein each of the heat sinks is in operative contact with at least one of the electronic components.

3. The system of claim 2 wherein each of the heat sinks comprises fins extending into the interior of the tunnel.

4. The system of claim 2 wherein the interior of the tunnels is isolated from the electronic components.

5. The system of claim 1, further comprising:
   a fan adjacent each of the inlets; and
   a venturi for increasing airflow to the fan.

6. The system of claim 1, wherein the air tunnels each include a plenum for directing air from the inlet to the pair of opposed heat sinks.

7. The system of claim 2, wherein each air tunnel includes a splitter downstream of the first pair of heat sinks for splitting the air tunnel into first and second branches, wherein each of the first and second branches is at least partially defined by pairs of opposed heat sinks.

8. The system of claim 7 wherein each of the heat sinks defining the first and second branches comprises fins extending into the interior of the branches.

9. The system of claim 8 wherein the interior of the branches is isolated from the electronic components.

10. The system of claim 9 wherein the air tunnel further includes a collector, which directs airflow from the first and second branches to the outlet.

11. The system of claim 1 wherein the housing includes front and rear panels having the outlets and inlets of the tunnels defined therein.

12. A heat dissipation system for an audio amplifier, comprising:

(a) a housing having a plurality of apertures therein;

(b) at least one completely enclosed air tunnel, the air tunnel extending between two apertures in the housing, the air tunnel at least partially defined by a pair of opposed heat sinks mounted within the housing, wherein the air tunnel comprises a plenum directing air from one of the apertures into the space between the pair of opposed heat sinks and a collector for directing air from the space between the pair of opposed heat sinks to another of the apertures.

13. The system of claim 12 wherein the audio amplifier comprises at least one printed circuit board having a plurality of electronic components mounted thereon, wherein each of the heat sinks is in operative contact with at least one of the electronic components.

14. The system of claim 13 wherein each of the heat sinks comprises fins extending into the interior of the tunnel.

15. The system of claim 12 wherein the interior of the tunnel is isolated from the electronic components.

16. The system of claim 12, further comprising:

a fan adjacent at least one of the apertures; and a venturi for increasing airflow to the fan.

17. The system of claim 12, wherein the air tunnel includes a splitter downstream of the pair of heat sinks for splitting the air tunnel into first and second branches, wherein each of the first and second branches is at least partially defined by pairs of opposed heat sinks.

18. The system of claim 17 wherein each of the heat sinks defining the first and second branches comprises fins extending into the interior of the branches.

19. The system of claim 18 wherein the interior of the branches is isolated from the electronic components.

20. The system of claim 12 wherein the housing includes front and rear panels having the apertures of the tunnels defined therein.

* * * * *